United States Patent
Kang et al.

(10) Patent No.: US 7,235,452 B2
(45) Date of Patent: Jun. 26, 2007

(54) METHOD FOR FABRICATING CAPACITOR IN SEMICONDUCTOR DEVICE

(75) Inventors: Jae Il Kang, Kyoungki-do (KR); Sang Cheol Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/729,694

(22) Filed: Dec. 5, 2003

(65) Prior Publication Data
US 2004/0175884 A1 Sep. 9, 2004

(30) Foreign Application Priority Data
Mar. 5, 2003 (KR) .................... 10-2003-0013715

(51) Int. Cl.
*H01L 21/8242* (2006.01)
(52) U.S. Cl. .................... 438/396; 438/239; 438/253; 438/254; 438/397
(58) Field of Classification Search ................ 438/210, 438/239, 243, 244, 253, 254, 396, 397, FOR. 220, 438/FOR. 430
See application file for complete search history.

(56) References Cited

U.S. PATENT DOCUMENTS

| | | | |
|---|---|---|---|
| 6,285,053 B1 * | 9/2001 | Park | 257/306 |
| 6,403,431 B1 * | 6/2002 | Chung et al. | 438/296 |
| 6,483,141 B2 * | 11/2002 | Sano | 257/306 |
| 6,548,348 B1 * | 4/2003 | Ni et al. | 438/253 |
| 6,548,853 B1 * | 4/2003 | Hwang et al. | 257/306 |
| 6,730,956 B2 * | 5/2004 | Bae et al. | 257/306 |
| 6,759,704 B2 * | 7/2004 | Park | 257/306 |
| 2002/0058379 A1 * | 5/2002 | Sano | 438/253 |
| 2003/0162353 A1 * | 8/2003 | Park | 438/253 |
| 2003/0215983 A1 * | 11/2003 | Bae et al. | 438/118 |
| 2003/0235948 A1 * | 12/2003 | Park | 438/253 |
| 2004/0000684 A1 * | 1/2004 | Park | 257/304 |

* cited by examiner

*Primary Examiner*—Matthew Smith
*Assistant Examiner*—Joannie Adelle Garcia
(74) *Attorney, Agent, or Firm*—Ladas & Parry LLP

(57) ABSTRACT

A method for fabricating a capacitor in a semiconductor device is disclosed. The method comprises the steps of: forming an interlayer insulating film on a semiconductor substrate, which includes a first contact hole exposing a certain portion of the substrate; forming a storage node plug filling the first contact hole; forming a first insulating film, a first silicon nitride film, and a second insulating film sequentially above the substrate inclusive of the storage node plug; forming a second contact hole that exposes the storage node plug by removing the second insulating film, the first silicon nitride film, and the first insulating film partly; forming a recessed portion at side surfaces of the second contact hole by wet-etching the first insulating film remained in the second contact hole; forming a storage node electrode of the capacitor, which is connected to the storage node plug, by filling the second contact hole inclusive of the recessed portion; removing the remained second insulating film; and forming a dielectric film and a plate electrode sequentially on the entire surface of the storage node electrode structure.

6 Claims, 6 Drawing Sheets

METHOD FOR FABRICATING CAPACITOR IN SEMICONDUCTOR DEVICE

BACKGROUND OF THE INVENTION

1. Field of the Invention

The present invention relates to a method for fabricating a capacitor in a semiconductor device, and more particularly to a method for fabricating a capacitor which can prevent bridging of a storage node electrode by increasing bottom area of the storage node electrode and forming a prevention portion of the storage node on the bottom area.

2. Description of the Prior Art

As generally known in the art, a capacitor is an element that stores electric charges and supplies them to drive a semiconductor device, and it is generally known that size of unit cell has decreased and capacitance has increased to drive the semiconductor device by a little with the advance of high integration of the semiconductor device.

Although it has been necessary to minimize a capacitor with the advance of the high integration of a semiconductor device, limitations exist in storing electric charges, and it has been difficult to highly integrate the capacitors in comparison with the size of the cell. Accordingly, structure for storing electric charges of a capacitor has been variously studied to settle the above problems occurring in minimization of the capacitor.

Method of utilizing substance with a high dielectric ratio, method of decreasing thickness of a dielectric substance, and method of increasing surface area of a capacitor, which is a primarily utilized method in recent years, etc., have been adapted to increase electric charges of a capacitor.

Referring to structures of electric charge storing electrode in a capacitor, they can be largely divided into a stacking structure in which several layers are formed on small areas to obtain large area of a capacitor, a groove structure in which grooves of desired depth are formed on a substrate of a semiconductor and a capacitor is formed on them thereby storing the electric charges thereon.

Specifically, the stacking structure includes fin type structure that is formed in a fin shape, a cylindrical type structure that is formed in a cylinder shape, and a modified cavity type structure such as HSG (Hemispherical Shaped Grains) and Bellows, which is modified from a cavity type structure in order to increase capacitance of a capacitor.

However, when the method of utilizing substance of a big dielectric ratio in order to increase storing capacity of electric charges in DRAM device of a semiconductor, limitations arise as a result of such substances with large dielectric ratio not being diversified. Accordingly, the capacity of storing electric charges depends on the sort of a certain substance being chosen.

FIG. 1 is a cross-sectional view for showing a method for forming a capacitor of a semiconductor device according to a prior art.

First, as shown in FIG. 1, a polysilicon layer 5 and a hard-mask layer 10 are sequentially stacked on a semiconductor substrate (not shown) having a desired lower structure, and etching is selectively performed on these layers to form gates G1 and an insulation spacer 2 at both sides of the gates G1.

Subsequently, a first polysilicon layer is formed on the substrate inclusive of the gates G1, and this layer is planarized to form plugs 15 that fill spaces made between the gates G1.

Then, a first interlayer insulation layer 20 is formed on the resultant substrate inclusive of the gates G1, and selective etching of this layer is performed to form a first contact hole (not shown) that exposes the plug 15, and a storage node electrode 25 filling the first contact hole is formed.

Thereafter, a silicon nitride film 30 and a PSG (Phosphorous Silicate Glass) layer 32 are formed sequentially on the resultant substrate, and these layers are selectively etched till an upper surface of the storage node plug 25 is exposed thereby forming a second contact hole 34.

Then, a polysilicon layer (not shown) for a storage node electrode is formed in the second contact hole 34 and is etched back, then the deepening-out of the PSG layer is performed to obtain a cylindrical type storage node electrode 35 bridging the storage node plug 25.

FIG. 2 is a cross-sectional view of a process for showing problems occurring in the prior art.

However, as shown in FIG. 2, according to the above prior art, when the cylindrical type storage node electrode has been formed and a cleaning process of the electrode has been performed, the storage node electrode is tilted to an adjacent storage node electrode, resulting in bridging defects between the storage node electrodes.

SUMMARY OF THE INVENTION

Accordingly, the present invention has been made to solve the above-mentioned problems occurring in the prior art, and an object of the present invention is to provide a method for fabricating a capacitor in a semiconductor device which can improve production yield by preventing tilt of the storage node electrode thereby resulting in the elimination of the defects originated from a bridging phenomenon.

In order to accomplish this object, there is provided a method for fabricating a capacitor in a semiconductor device, the method comprising the steps of: forming an interlayer insulating film on a semiconductor substrate, which includes a first contact hole exposing a certain portion of the substrate; forming a storage node plug filling the first contact hole; forming a first insulating film, a first silicon nitride film, and a second insulating film sequentially above the substrate inclusive of the storage node plug; forming a second contact hole that exposes the storage node plug by removing the second insulating film, the first silicon nitride film, and the first insulating film partly; forming a recessed portion at side surfaces of the second contact hole by wet-etching the first insulating film remained in the second contact hole; forming a storage node electrode of the capacitor, which is connected to the storage node plug, by filling the second contact hole inclusive of the recessed portion; removing the remained second insulating film; and forming a dielectric film and a plate electrode sequentially on the entire surface of the storage node electrode structure.

Also, a step of forming a second silicon nitride film above the resultant substrate inclusive of the first contact hole can be added, before forming the first insulating film.

Further, the first insulating film has etching rate faster than that of the first silicon nitride film, and comprises a BSPG film.

Moreover, the second insulating film comprises a PSG film and is formed to a thickness of 10000~20000 Å.

Also, the recessed portion of the storage node electrode has a broader width than that of any other portion of the storage node electrode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
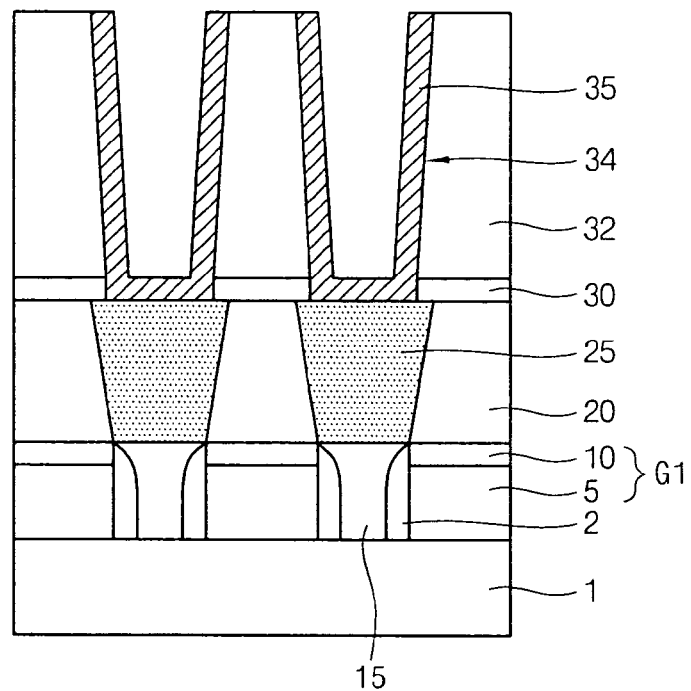
FIG. 1 is a cross-sectional view showing a method for forming a capacitor of a semiconductor device according to a prior art.
Figure 2:
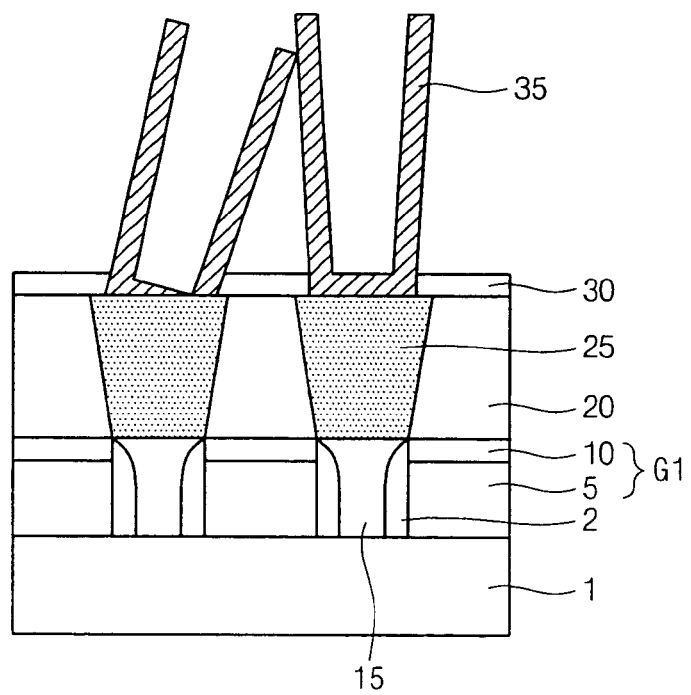
FIG. 2 is a cross-sectional view for showing problems originated from the prior art.

Hereinafter, preferred embodiments of the present invention will be described with reference to the accompanying drawings. In the following description and drawings, the same reference numerals are used to designate the same or similar components, and so repetition of the description on the same or similar components will be omitted.

FIGS. 3A through 3H are cross-sectional views showing each process of a method for fabricating a capacitor of a semiconductor device according to one embodiment of the present invention.

Figure 3A:
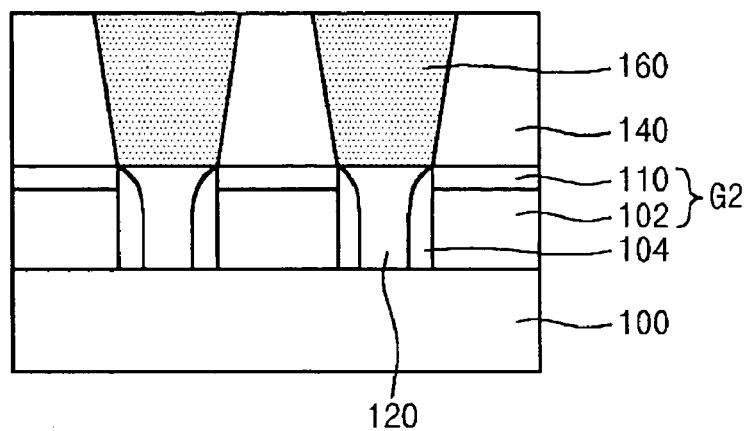
FIGS. 3A through 3H are cross-sectional views showing each process of a method for fabricating a capacitor of a semiconductor device according to one embodiment of the present invention.

First, as shown in FIG. 3A, a polysilicon layer 102 and a hard-mask layer 110 for forming gates are sequentially stacked on a semiconductor substrate 100 having a certain lower structure and gates G2 are formed by masking etching, and then insulating spacers 104 are formed at both sides of the gates G2.

Subsequently, after forming a polysilicon layer (not shown) for plugs on the substrate inclusive of the gates G2, planarization of the layer is performed to form plugs 120 filling spaces made between the gates G2. In this process, although not shown in the drawing, the plugs 120 are connected to impurity regions of source/drain below the substrate.

Then, an interlayer insulating film 140 is formed above the resultant substrate inclusive of the plugs 120, and the interlayer insulating film is selectively etched to form a first contact hole (not shown) that exposes the plugs 120.

Thereafter, a polysilicon layer for a storage node contact is formed above the resultant substrate inclusive of the first contact hole, and it is planarized to form storage node plugs 160 filling the contact hole.

Figure 3B:
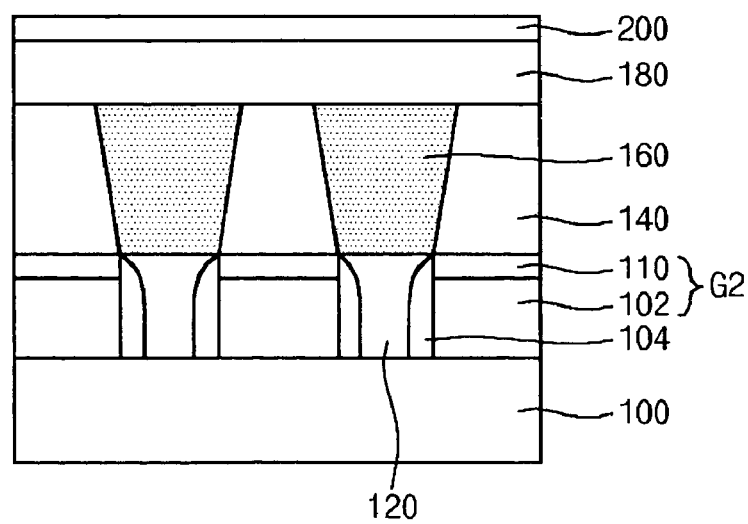

Referring to FIG. 3B, a first insulating film 180 is formed to a thickness of 500~1000 Å A above the resultant substrate inclusive of the storage node plugs 160, and the first insulating film 180 has faster etching rate than that of a silicon nitride film 200 that works as a etching barrier film at the time of following wet-cleaning. In this process, a BPSG (Borophosphosillcate glass) film is adapted as the first insulating film 180.

Subsequently, the silicon nitride film 200 is formed above the first insulating film 180 to a thickness of 500~1000 Å. In this process, the silicon nitride film 200 is used as an etching barrier film at the following deepening-out process by means of the wet-cleaning.

Figure 3C:
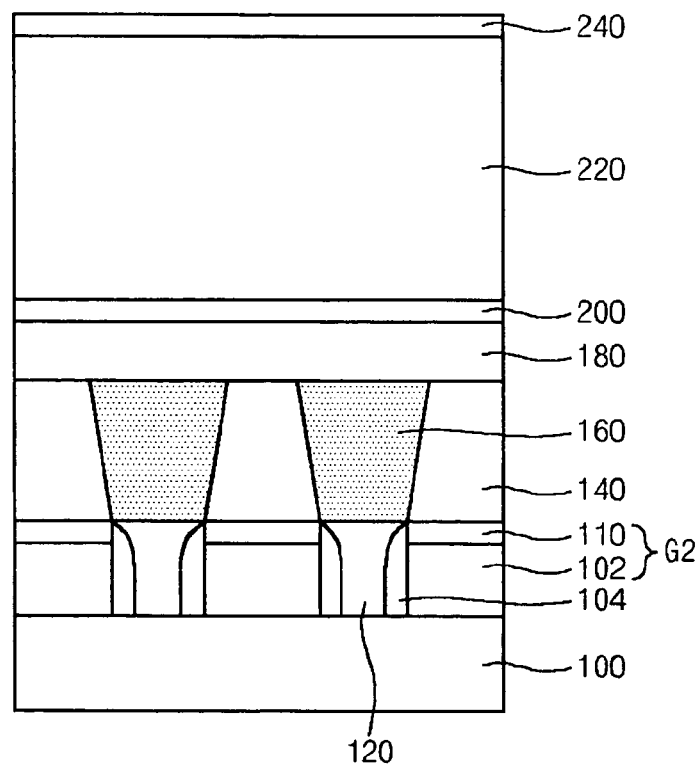

Referring to FIG. 3C, a second insulating film 220 is formed above the silicon nitride film 200 to a thickness of 10000~20000 Å that is the same thickness of the desired storage node electrode. In this process, a PSG film is adapted as the second insulating film 220.

Then, a polysilicon layer 240 for a hard-mask is formed to a thickness of 2000~5000 Å above the second insulating film 220.

Figure 3D:
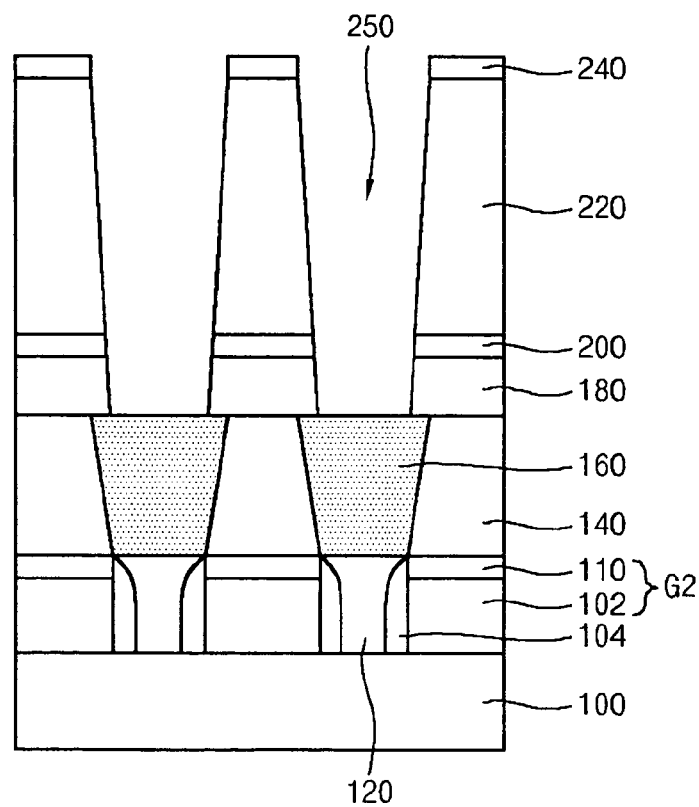

Referring now to FIG. 3D, a mask pattern (not shown) for making a storage node electrode is formed above the polysilicon layer 240 for making a hard-mask by using a photoresist (not shown), and the polysilicon layer 240 for the hard-mask is partly dry-etched by using the mask pattern.

Then, after the mask pattern for making the storage node electrode is removed, the second insulating film 220, the silicon nitride film 200, and the first insulating film 180 is dry-etched by using the polysilicon layer 240 for the hard-mask remained after the etching as a barrier thereby forming a second contact holes 250 that expose the storage node plugs 160.

Figure 3E:
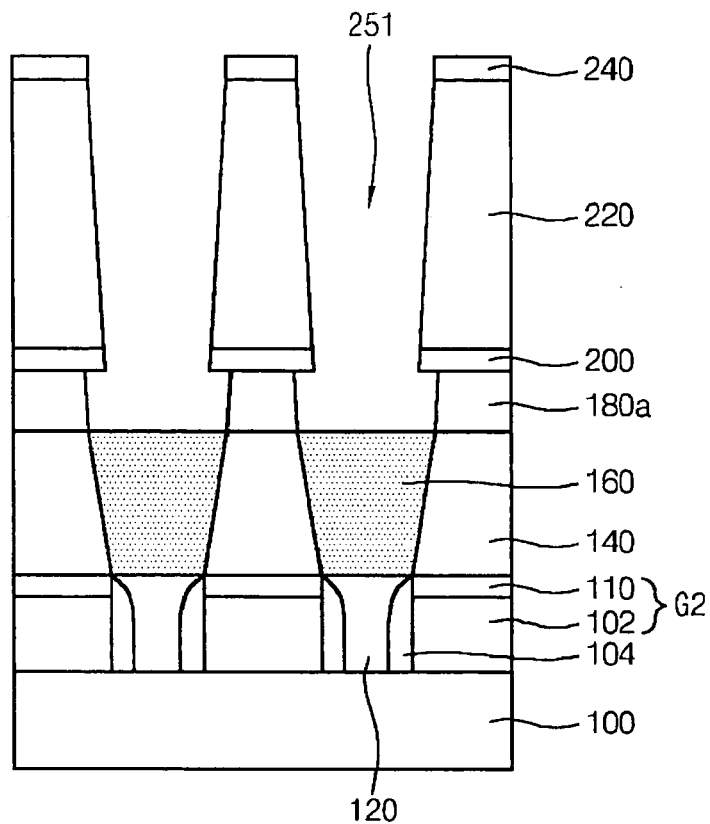

Referring now to FIG. 3E, a deepening-out process is performed above the resultant substrate by using wet-cleaning to partly etch side surfaces of the first insulating film 180 to thereby forming a recessed portion 180a in the insulating film 180.

Accordingly, the recessed portion of the storage node electrode has a broader width than that of any other portion of the storage node electrode. In this drawing, the drawing numeral 251 refers to the same second contact hole 250 but formed after the completion of the wet-cleaning process. Therefore, FIG. 3E shows the second contact hole 251 having the recessed portion 180a at the bottom, but FIG. 3D does not.

Figure 3F:
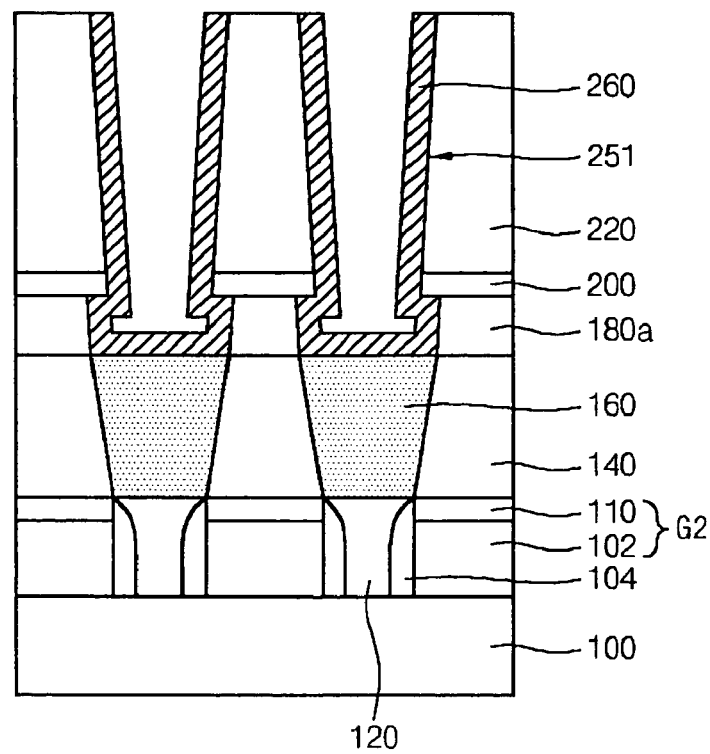

Referring now to FIG. 3F, a doped or non-doped polysilicon layer (not shown) for a storage node is formed above entire resultant substrate to a thickness of 300~500 Å so that the second contact holes 251 made after the completion of the wet-cleaning process are filled.

Then, a CMP (Chemical Mechanical Polishing) process or etch-back process is performed to the resultant substrate in order to expose upper surface of the second insulating film 220 thereby separating the polysilicon layer for the storage node. In this drawing, drawing numeral 260 refers to a storage node electrode of a capacitor, which is connected to the storage node plug 160.

Figure 3G:
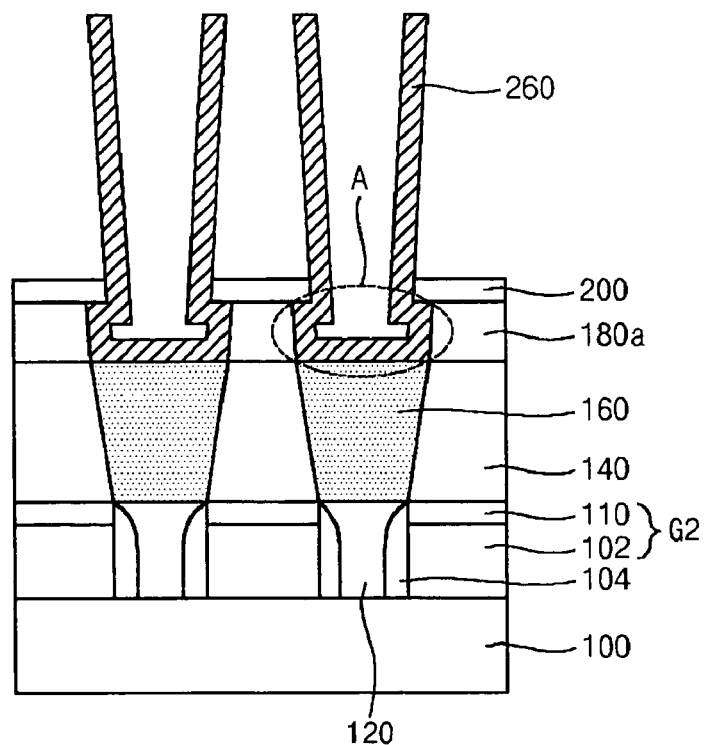

Referring to FIG. 3G, a deepening-out process of the PSG layer 220 is performed by wet-cleaning.

In this process, the storage node electrode 260 becomes to equip with wide bottom area (denoted by "A") to construct very stable shape thereby preventing tilting phenomenon occurred between the adjacent storage node electrodes. Further, surface area of the storage node electrode 260 is increased due to the wide bottom area thereof, thereby increasing the capacitance at the time of making a following dielectric film.

Also, when a MPS (Metastable Phase Silicon) layer is grown on a surface of the storage node electrode 260, it can increase the surface area thereof, thereby increasing the capacitance of the capacitor.

Figure 3H:
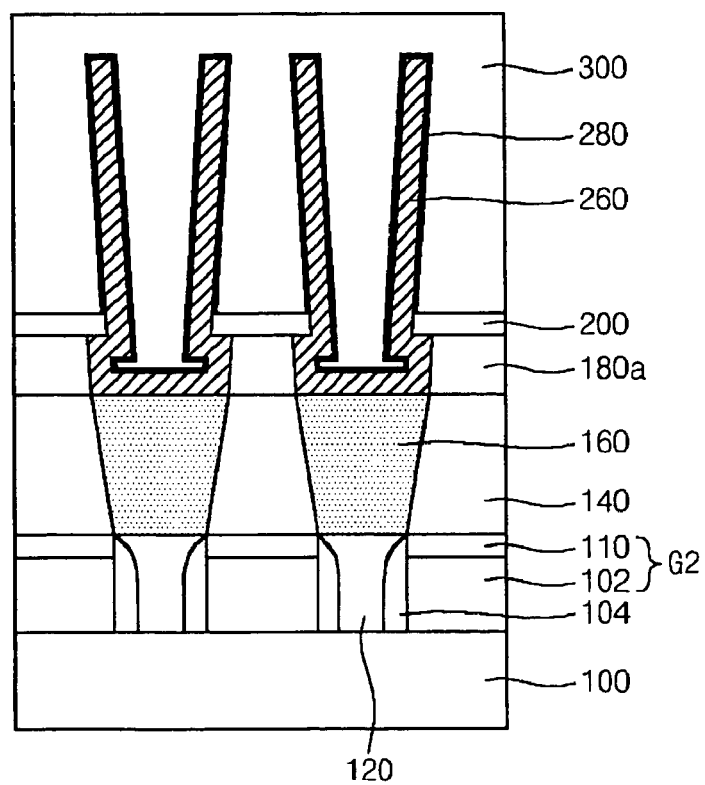

Referring now to FIG. 3H, a dielectric film 280 is formed on the surface of the storage node electrode 260 by using $Ta_2O_5$ or NO.

Then, a polysilicon layer 300 for a plate electrode is formed above whole resultant substrate to cover the dielectric film 280 to a sufficient thickness by using any one selected from the group consisted of doped polysilicon, Ti, and TiN thereby completing the capacitor.

Figure 4:
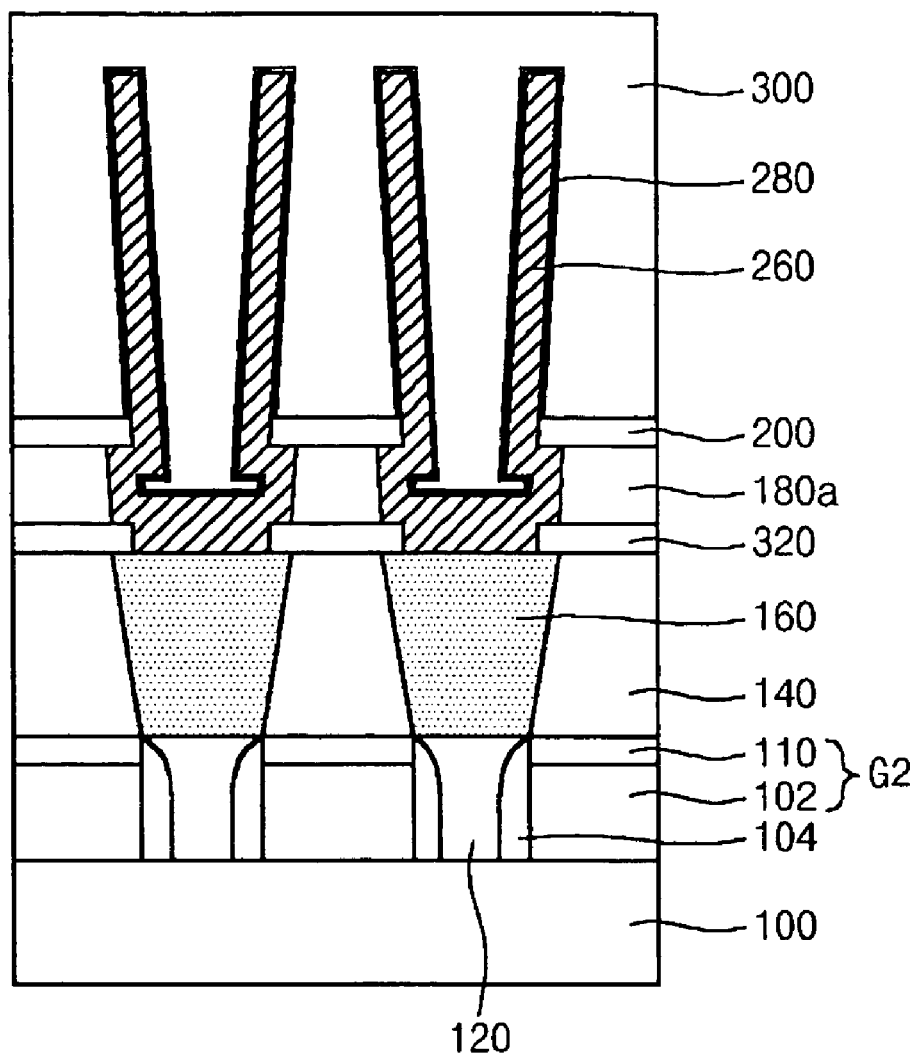
FIG. 4 is a cross-sectional view showing process of the method for fabricating a semiconductor device according to another embodiment of the present invention.

FIG. 4 is a cross-sectional view showing process of the method for fabricating a semiconductor device according to another embodiment of the present invention.

As shown in FIG. 4, before forming the second interlayer insulating film 180 above the resultant substrate inclusive of the polysilicon layer 160, a silicon nitride film 320 is formed to at thickness of 300~1000 Å thereby using it as an etch barrier film in the wet-etching process.

As explained above, according to the method for fabricating a capacitor in a semiconductor device of the present invention, tilting phenomenon of the storage node electrode in the integrated DRAM is prevented, thereby improving defects originated from the bridging of the electrodes and obtaining production yield increase.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor in a semiconductor device, the method comprising the steps of:
    forming an interlayer insulating film on a semiconductor substrate, which includes a first contact hole exposing a portion of the substrate;
    forming a storage node plug filling the first contact hole;
    forming a first insulating film, a first silicon nitride film, and a second insulating film sequentially above the substrate inclusive of the storage node plug;
    forming a second silicon nitride film at least on the interlayer insulating film, before forming the first insulating film wherein the first and second silicon nitride films are substantially parallel to each other;
    forming a second contact hole that exposes the storage node plug by removing the second insulating film, the first silicon nitride film, the first insulating film partly and the second silicon nitride film;
    forming a recessed portion at side surfaces of the second contact hole and below the first silicon nitride film by wet-etching the first insulating film remained in the second contact hole;
    forming a storage node electrode of the capacitor, which is connected to the storage node plug, by filling the second contact hole inclusive of the recessed portion;
    removing the remained second insulating film;
    forming a dielectric film on the storage node electrode; and
    forming a plate electrode on the dielectric film and the silicon nitride film.

2. The method as claimed in claim 1, wherein the first insulating film has an etching rate faster than that of the first silicon nitride film.

3. The method as claimed in claim 2, wherein the first insulating film comprises a BSPG film.

4. The method as claimed in claim 1, wherein the second insulating film is formed to a thickness of 10000~20000 Å.

5. The method as claimed in claim 1, wherein the second insulating film comprises a PSG film.

6. The method as claimed in claim 1, wherein the recessed portion of the storage node electrode has a broader width than that of any other portion of the storage node electrode.

* * * * *